(12) United States Patent
Gutierrez Martinez

(10) Patent No.: US 9,863,996 B2
(45) Date of Patent: Jan. 9, 2018

(54) APPARATUS AND PROCESS FOR TESTING AND IMPROVING ELECTRICAL AND/OR MECHANICAL CHARACTERISTICS OF AN ELECTRICAL CONNECTION

(71) Applicant: Carlos Gutierrez Martinez, Ypsilanti, MI (US)

(72) Inventor: Carlos Gutierrez Martinez, Ypsilanti, MI (US)

( * ) Notice: Subject to any disclaimer, the term of this patent is extended or adjusted under 35 U.S.C. 154(b) by 80 days.

(21) Appl. No.: 14/568,003

(22) Filed: Dec. 11, 2014

(65) Prior Publication Data

US 2015/0168479 A1 Jun. 18, 2015

Related U.S. Application Data

(60) Provisional application No. 61/915,059, filed on Dec. 12, 2013.

(51) Int. Cl.
*G01R 31/00* (2006.01)
*G01R 31/04* (2006.01)

(52) U.S. Cl.
CPC .................. *G01R 31/045* (2013.01)

(58) Field of Classification Search
CPC .............................. G01R 31/04; G01R 31/045
USPC ........................................................ 324/538
See application file for complete search history.

(56) References Cited

U.S. PATENT DOCUMENTS

| | | | |
|---|---|---|---|
| 4,599,905 A | 7/1986 | Vogel et al. | |
| 4,769,607 A * | 9/1988 | Bauman | G01N 27/07 324/439 |
| 6,289,742 B1 | 9/2001 | DeAngelis | |
| 6,903,561 B2 | 6/2005 | Fairchild et al. | |
| 7,992,449 B1 | 8/2011 | Mahmoud | |
| 9,245,668 B1 * | 1/2016 | Vo | H01B 11/04 |
| 9,302,397 B2 * | 4/2016 | Kimoto | B25J 19/0025 |
| 2002/0066588 A1 * | 6/2002 | King, Jr. | H01R 4/22 174/87 |
| 2008/0152791 A1 * | 6/2008 | Kyle | C09D 5/24 427/125 |
| 2009/0019941 A1 | 1/2009 | Syles | |
| 2009/0219031 A1 | 9/2009 | Engbring et al. | |
| 2011/0028047 A1 * | 2/2011 | Wang | H01R 4/2433 439/673 |

* cited by examiner

*Primary Examiner* — Jeff Natalini
(74) *Attorney, Agent, or Firm* — Varnum, Riddering, Schmidt and Howlett, LLP

(57) ABSTRACT

An apparatus for testing a quality of an electrical connection of a test part is disclosed. The apparatus includes a first fixture holding the test part to one side of the electrical connection, a second fixture holding the test part to a second side of the electrical connection, wherein the first fixture and the second fixture apply a twist to the test part, and a electrical test module configured to test an electrical resistance of the electrical connection when the twist is applied.

20 Claims, 9 Drawing Sheets

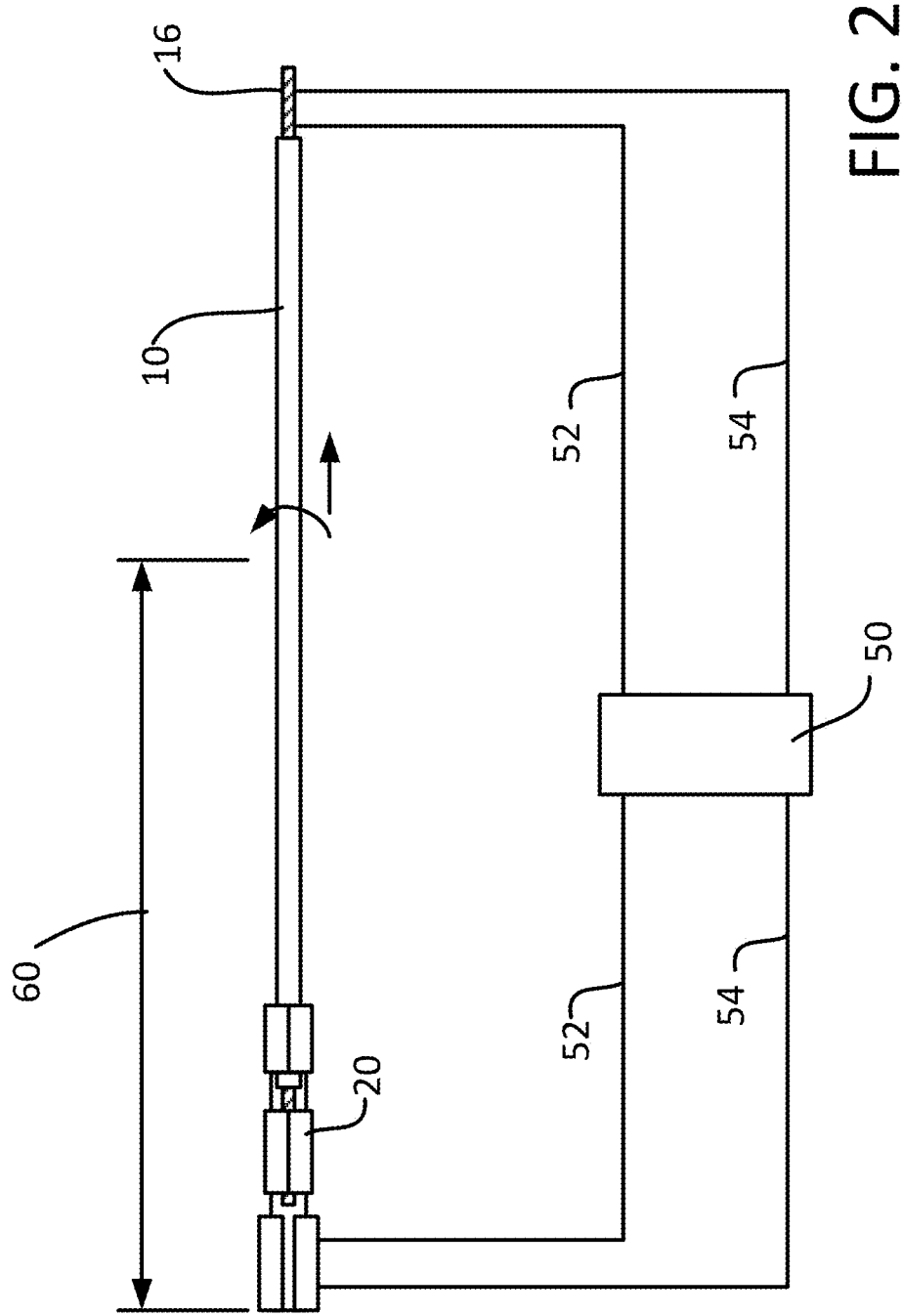

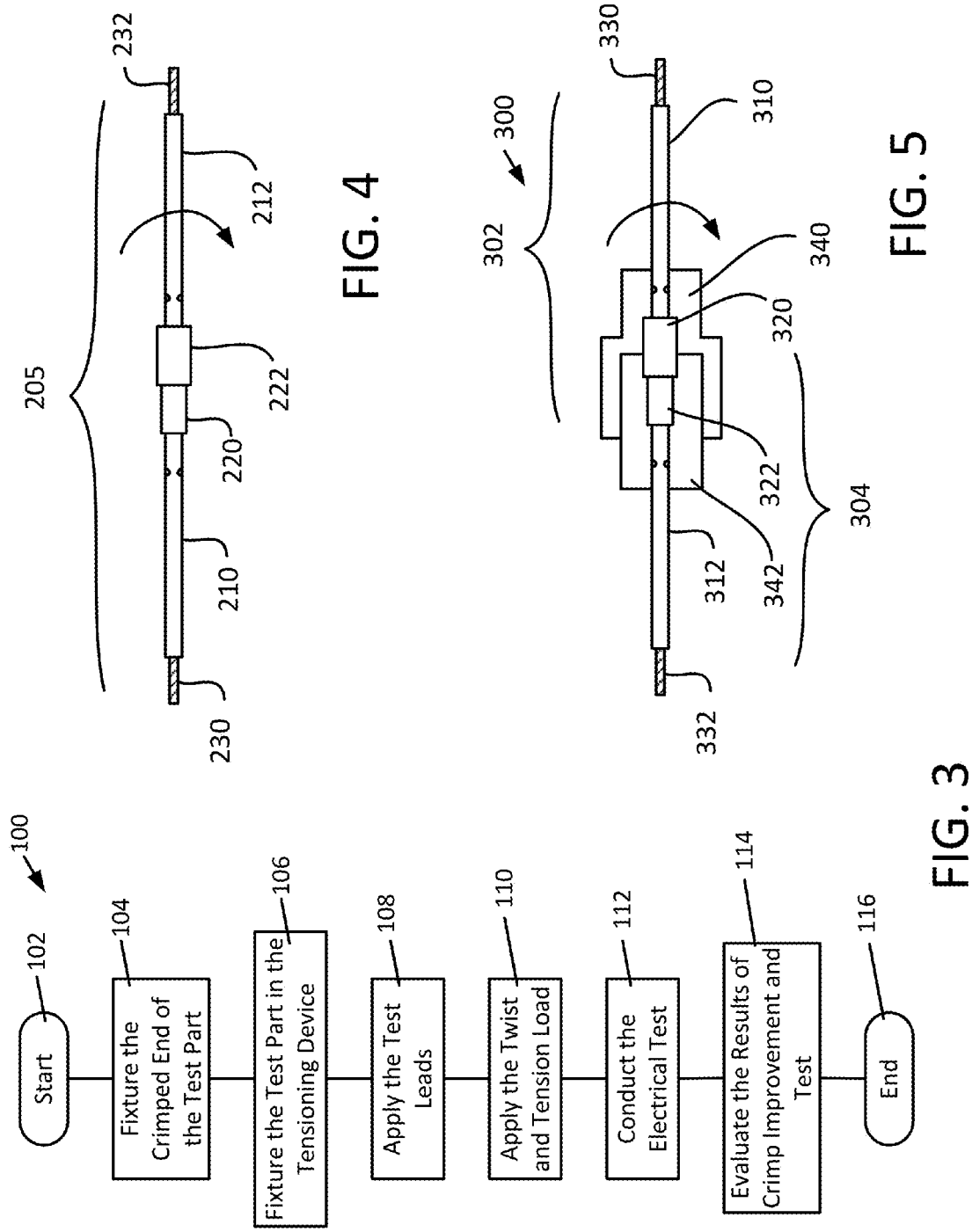

APPARATUS AND PROCESS FOR TESTING AND IMPROVING ELECTRICAL AND/OR MECHANICAL CHARACTERISTICS OF AN ELECTRICAL CONNECTION

CROSS REFERENCE TO RELATED APPLICATIONS

This disclosure claims the benefit of U.S. Provisional Application No. 61/915,059 filed on Dec. 12, 2013 which is hereby incorporated by reference.

TECHNICAL FIELD

This disclosure is related to testing and improving the electrical and or mechanical characteristics of a terminal crimped wire. In particular, the disclosure is related to a test and process of applying a twist and/or a tension load to a terminal crimped wire bundle to evaluate and characterize the quality of the crimp.

BACKGROUND

The statements in this section merely provide background information related to the present disclosure. Accordingly, such statements are not intended to constitute an admission of prior art.

Wire harnesses are used in a multitude of applications to electrically connect devices and systems. Wire harnesses can be used in automotive, appliances, aeronautical, computer, or other similar applications. Quality of crimped wire bundles is critical especially for circuitry used for signal processing and other applications where maximum allowable resistance of the crimp is measured in milli-ohms. A wire bundle includes a plurality of individual metallic wire strands. Each of the wire strands are in direct metal to metal contact with each other and collectively serve to transmit current along the wire bundle. The wire bundle is typically wrapped or coated with an insulator.

Wire harnesses frequently involve a plurality of wire bundles connected together wherein each wire bundle includes at least two ends. Each end of a wire bundle needs to establish an electrical connection with another object. The other object can be a device, an inline connector, a computerized module, or another wire bundle. Electrical connectors are known in the art, wherein a single wire bundle or a plurality of wire bundles are able to be plugged into another connector. Such connectors are frequently fool-proofed, wherein they can only be connected in one orientation, such that only the desired electrical connections can be made.

While electrical connectors are frequently molded plastic structures, the wire bundles that go into the electrical connectors need a conductive interface with wire surfaces or conductive circuitry leading into the mating electrical connector. Wire bundles can be connected to a conductive interface embodied as a crimped end interface or a crimped end. Such a crimped end or terminal can project from the wire bundle as a pin or male connector or a slot or female connector. A terminal interconnection system involves a male terminal inserted into a female terminal. On any terminal, the crimped end frequently includes a pair of tabs or a barrel that are folded over and pressed tightly or crimped around an exposed metal tip of the associated wire bundle. The crimped end can also include a similar crimp connection to an insulator or polymer coating of the wire bundle around the metal wire bundle. Such an insulation crimp can provide strain relief. In one exemplary configuration, a water proof grommet known in the art can be placed between the crimped end and the wire insulator, such that a water proof connection to a connector can be subsequently made. Wire bundles can also be connected to terminals with another method, such as insulation displacement termination or welding. Both the crimped connection from the crimped end to the exposed metal wire bundle and to the insulator are both important to the long term performance and reliability of the wire bundle. A bad crimp or a failed crimp can lead to intermittent or failed connection of the electrical wire bundle to the intended circuitry.

Testing of crimped wire connections and terminal interconnection systems for reliability and performance of the connection and/or quality of the crimp or crimps frequently includes durability testing, wherein the wire bundle is connected and resistance as a measure of the electrical connection is monitored over a long period of time. Temperature and humidity may be varied over the test period to simulate environmental effects upon the terminals, the wire bundle and the crimped portions.

SUMMARY OF THE DISCLOSURE

An apparatus for testing a quality of an electrical connection of a test part is disclosed. The apparatus includes a first fixture holding the test part to one side of the electrical connection, a second fixture holding the test part to a second side of the electrical connection, wherein the first fixture and the second fixture apply a twist to the test part, and a electrical test module configured to test an electrical resistance of the electrical connection when the twist is applied.

BRIEF DESCRIPTION OF THE DRAWINGS

One or more embodiments will now be described, by way of example, with reference to the accompanying drawings, in which:

FIG. 2 illustrates in further detail the test apparatus of FIG. 1, in accordance with the present disclosure; and FIG. 3 illustrates an exemplary crimp improvement and test process that can be utilized to improve and test a crimp connection, in accordance with the present disclosure;

FIG. 4 illustrates an exemplary configuration testing of a pair of connected terminals, in accordance with the present disclosure;

FIG. 5 illustrates an exemplary configuration testing of a plastic connector with connected terminals therewithin, in accordance with the present disclosure;

DETAILED DESCRIPTION

Figure 1:
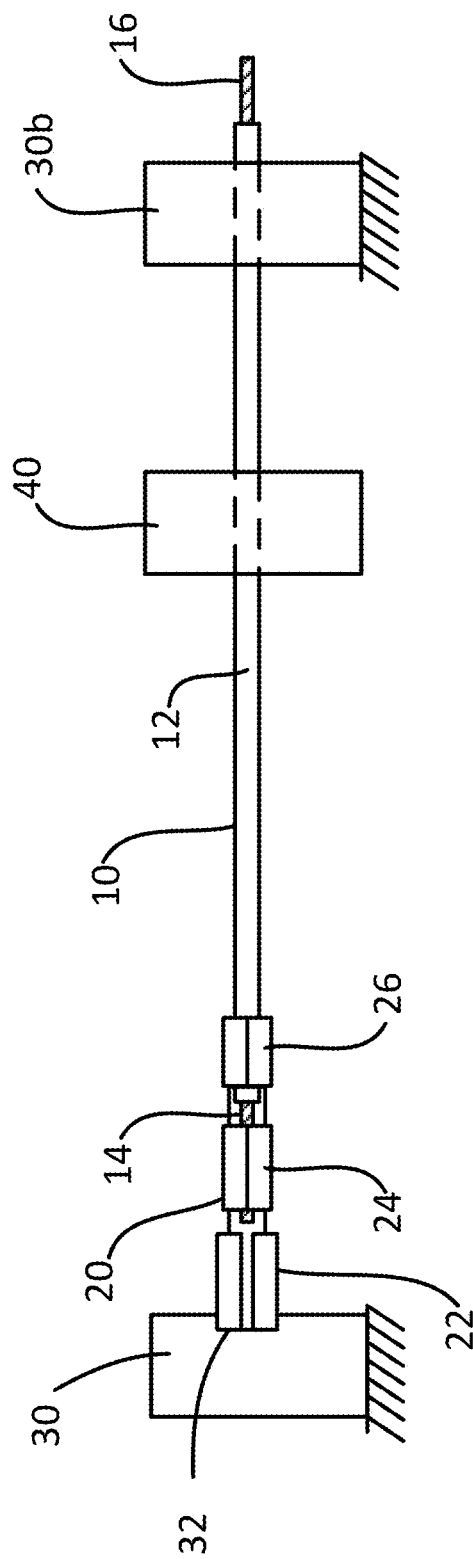
FIG. 1 illustrates an exemplary wire processing and test apparatus for conducting an embodiment of a disclosed crimp improvement and test process, in accordance with the present disclosure.

A wire bundle used in a wire harness or other construction includes a metal wire core. The metal wire bundle typically includes a plurality of metallic wire strands. These metal strands are typically extruded and frequently wrapped around each other to form a spiraled wire bundle. This spiraled wire bundle can be coated with a polymer insulator.

Furthermore, during the wire harness manufacturing process, wire bundles can additionally be twisted, wrapped around each other, or otherwise deformed and wrapped with tape or other protective materials. Additionally, as a wire connector is inserted into a cavity of a connector, the wire bundle may need to be twisted to correctly orientate the wire connector to the cavity. Other twisting and pulling forces may be applied to the wire harness during its installation on the vehicle.

Metals have memory. A piece of metal typically resists against being bent out of an original shape in which the metal was formed. When a straight wire strand is spiraled with other spiraled wire strands, the wire strands include a restorative force whereby the wire strands tend toward returning to a original shape. Among other forces and factors, this restorative force over time can affect the quality of a crimp connection, with the spiraled and twisted wire bundle and/or the insulation tending to dislodge from the crimped tabs of the crimped end. Similarly, the restorative force applied by the wire bundle can tend to twist the insulator and degrade a crimp quality between the conductor and an associated crimp end.

Further, no surface is perfectly flat nor perfectly clean. Every wire strand surface and connector terminal surface includes asperities or high points that are only apparent at a micro level. These asperities stop a surface from coming into complete contact, and instead, the surfaces tend to come into contact in approximately circle shaped contact zones with a radius "a" at each asperity (known in the art as a-spots). Current flowing from one metallic part to another must flow through the asperities. Between asperities, there are gaps through which current cannot flow. Contact resistance (Rk) for a contact area connected by an asperity contact zone (a spot) with a radius "a" and contacting a first metal with electric resistivity ($R_1$) and a second metal with a electric resistivity ($R_2$) with the presence of a film with film resistivity "Rf" and film thickness "d" is represented as the sum of constriction resistance and film resistance and can be described by Equation 1.

$$R_k = \{(R_1 \pm R_2)/2*a\} + \{(Rf*d)(\pi*a^2)\} \quad (1)$$

Electrical resistance and its variation can be used as a criterion to characterize the quality of contacts between wire strands and the terminal and between the wire strands and each other. It can also be used to characterize the quality of a terminal interconnection system (male terminal inserted into a female terminal)

Metal surfaces include coatings or films, either intentionally applied to the metal or contamination by oxidation or intrusion of dirt or other contaminants. Films can increase electrical resistance between two metal parts in contact. Further, oxidation in areas exposed to air can increase a film effect over time. Variability in resistance through a test period or through manipulation of the parts can show presence of gaps between a wire bundle and a connector or between wire strands within a wire bundle. A connection including these gaps, over time, can exhibit increased degradation as compared to a connection without so many gaps, such that the part with the excessive gaps can be determined to be faulty based upon the initial variability in the resistance indicating likeliness to degrade due to oxidation. The same resistance variability can be present when the contact is made between two terminals (male connected to a female)

At the contact surfaces, clean metallic a-spots may be generated where protuberances are plastically deformed and surface films are ruptured. Such spots are cold-welded and therefore have a tendency to resist opening forces. Diffusion of oxygen into closed spots is as slow as oxygen diffusion into a solid metal. However, if the contact is opened and closed again, the air has an opportunity to deposit a physisorbed layer of oxygen (film is bound to the metal by means of VAN DER WAALS forces) on these spots. At least a part of that layer may be chemisorbed (film is bound to valences of the metal surface atoms by covalent bonds) and remain there, preventing a new cold weld from forming. We therefore can say that the contact has "BREATHED". Variability in resistance through a test period or through manipulation (BREATHING) of the contact parts can be defined and used to characterize the quality of the connection. For example, variability in resistance through a test period or test manipulation (breathing) of the contact parts can show the potential for gaps to appear between a wire bundle and a terminal barrel or between wire strands within a wire bundle during the life of the contact application. This variability can also be a result of breaking weak cold-welded a-spots during manipulation or the "BREATHING" process. A connection including these gaps, over time, can exhibit increased degradation as compared to a connection without so many gaps, such that the part with the excessive gaps can be determined to be faulty based upon the initial variability in the resistance indicating likeliness to degrade due to oxidation. The same resistance variability can be present when the contact is made between two terminals (male connected to a female)

Depending on the location of the strands, the strands may or may no have a direct contact with the terminal barrel. Electrical current traveling though one (outer) wire strand can pass directly from the wire strand into a terminal in contact with the wire strand. For strands that may not have a direct contact with the terminal barrel (inner strand), electrical current can additionally travel from one wire strand into another wire strand prior to traveling into a terminal. As the number of wire strands increases, the complexity of estimating a strand vs. strand resistance increases. A number of strand (n) vs. strand resistances that affects the overall resistance of the connection as a function of the number of strands (n) in a wire bundle can be described by the approximation equation 2.

$$Ri=Rb+Ri1+Ri2+Ri3+\ldots$$

$$Ri=Rb+\Sigma Rin$$

$$1/Ro=1/Rb+1/Ro1+1/Ro2+1/Ro3$$

$$1/Ro=1/Rb+\Sigma 1/Ron$$

$$RT=Ri+1/Ro \qquad (2)$$

A high quality crimped connection is stable with relatively few gaps between the wire strands and the terminal and between the wire strands themselves. Movement of the wire bundle, for example, routing the wire within a motor vehicle to make the necessary connections within the vehicle do not substantially increase or decrease the electrical resistance of the connection. A terminal, in a quality connection, firmly grips the wire bundle such that restorative forces within the wire bundle cannot weaken or dislodge the terminal's grip upon the wire bundle. Gaps within the connection between the metallic parts caused by asperities are small enough such that oxidation and subsequent degradation of the electrical connection caused by the oxidation will not cause the connection to malfunction over time. Similarly, a high quality terminal interconnection system (male terminal connected to a female terminal) will maintain an stable electrical resistance and endure the effects of intermittent contact, reduction of contact loads or forces, fretting corrosion and "breathing" of contact points between the two terminals.

A low quality crimped connection can be unstable and may permit relative movement between the wire bundle and the terminal. A low quality crimped connection can include a relatively large number of gaps with limited contact zones between the strands and the terminal or between the strands themselves. A low quality crimped connection can show relatively high variability in resistance based upon manipulation (or breathing) of the connection between the terminal and the wire bundle. A low quality terminal interconnection system (male terminal connected to a female terminal) will show an increase on electrical resistance due to the effects of intermittent contact, reduction of contact loads or forces, fretting corrosion and "breathing" of contact points between the two terminals.

A test process to test a connection quality between a terminal and a wire bundle (or between two terminals) and an apparatus to perform the test process are disclosed, including testing an initial electrical resistance for the connection, applying twisting forces to the connection, and testing and/or monitoring a change in electrical resistances for the connection with the twist applied. The initial twisting forces will attempt forcing the connection to "BREATHE" and/or to break existing weak connections or a-spots while a resistance variation can be measured and/or monitored. A resistance value for either reading (or its variation) higher than a threshold resistance can be used to indicate a low quality connection based upon poor connection between the wire bundle and the terminal (or between two connected terminals). A second resistance value (or set of resistances) that varies by more than a threshold resistance value can be used to indicate a poor quality connection based upon instability or a tendency for changed properties in the connection based upon force being applied to the wire bundle.

The disclosure discusses testing various forms of electrical connections. These electrical connections can include a wide variety of electrical connections, including a crimped connection joining a wire bundle to a terminal, an interference fit sliding connection between two terminals employing a terminal interconnection system, a selectively connected switch connection joining two metal terminals, and any other similar metal to metal electrical connection. The disclosed test apparatus and process can work to test any such electrical connections, in every instance where one particular type of electrical connection is mentioned or illustrated, the other types can be substituted therefore in each instance, and the disclosure is not intended to be limited to the particular examples provided herein.

Referring now to the drawings, wherein the showings are for the purpose of illustrating certain exemplary embodiments only and not for the purpose of limiting the same, FIG. 1 illustrates an exemplary wire bundle processing and test apparatus for conducting an embodiment of a disclosed crimp quality improvement and test process. Wire bundle sample 10 is illustrated including insulator 12, a first exposed wire end 14, and a second exposed wire end 16. Crimped end 20 is illustrated including exemplary female connection 22, wire crimp tabs 24, and insulator crimp tabs 26. A similar exemplary crimp end could include a male connection in place of female connection 22. In some cases, a cable seal or a water proof grommet can be included in the insulation crimp. Wire crimp tabs 24 have been compressed over wire end 14 such that the tabs grip the wire end. Insulator crimp tabs 26 have similarly been compressed over insulator 12. In combination, crimp tabs 24 and 26 hold the crimped end 20 onto wire bundle sample 10, crimp tabs 24 establish and electrical connection between wire end 14 and crimped end 20. A quality of that electrical connection is critical to operation of the associated electrical circuit served by the wire bundle.

Test fixture 30 is illustrated including an exemplary fixed or stationary fixture, holding crimped end 20 in a stationary position. Test fixture 40 is illustrated as an exemplary moving fixture, wherein movement of fixture 40 twists wire bundle sample 10. Fixture 30 holds the test part to one side of the electrical connection between the wire end 14 and crimped end 20, and fixture 40 holds the test part to the other or a second side of the electrical connection in order to apply a twisting force upon the electrical connection. In one embodiment, fixture 40 only applies a twisting force upon sample 10. In another embodiment, fixture 40 applies both a twisting and a tensile force upon sample 10. By gripping wire bundle sample 10 within test fixtures 30 and 40, and then applying a calibrated movement of fixture 40, a calibrated test condition including a particular twist and a particular tension can be applied to test sample 10. An optional additional test fixture 30b is illustrated holding a distal end of wire bundle sample 10. Test fixture 30b along with the other fixtures permits the wire bundle to be twisted in one direction to one side of test fixture 40 and in the other direction to the other side of fixture 40. While FIG. 1 illustrates the stationary fixture holding the crimped end and the moving fixture holding a middle of the wire bundle sample, reverse conditions could be utilized in the fixture with the fixture holding the end moving and the fixture holding the end being stationary. Similarly, both fixtures could move. A number of test fixtures could be used to create the tension and twist disclosed for use with the disclosed crimp improvement and test process, and the disclosure is not intended to be limited to the particular examples provided herein.

A moving fixture such as fixture 40 can be controlled according to a number of exemplary control systems. For example, a computerized module can be programmed with instructions to move fixture 40 to a first position to initiate the crimp improvement and test, whereat the wire bundle sample can be loaded into the fixtures, and then the module can move fixture 40 to a second position, wherein the second position creates the desired tension and twist in the wire bundle sample. Such computerized control of the fixture can be accomplished through computerized control of one or more electrical motors connected to the fixture. A similar configuration could be constructed, wherein an operator could manually provide an input, such as depressing a lever. The lever could be connected to a stopper, such that full motion of the lever delivers precisely the required actuation of the moving fixture to create the twist and tension desired in the wire bundle sample. In another embodiment, the lever can be keyed to a meter, for example, measuring linear displacement of the wire bundle sample, wherein a calibrated reading on the meter can be used to instruct the operator when to stop depressing the lever. A number of exemplary test controls are envisioned, and the disclosure is not intended to be limited to the particular exemplary embodiments provided herein.

FIG. 2 illustrates in further detail the crimp improvement and test apparatus of FIG. 1. Wire bundle sample 10 is illustrated including crimped end 20 and exposed wire end 16. A calibrated distance 60 is illustrated, whereat the moving fixture applies the disclosed tension and twist to wire bundle sample 10. An electric test module embodied as a resistance meter 50 is illustrated for use in measuring resistance across the wire bundle sample according to known methods. In an exemplary method circuit 54 is used to apply a voltage across wire bundle sample 10, and resistance is measured across circuit 52. Resistance meter 50 can be replaced or complimented with another type of functional tester or conditioner apparatus, such as thermal imaging, ultrasonic tester, heated air and/or humidity blower, thermal shock chamber, temperature and humidity chamber, etc. A number of testing devices known in the art can be used with the disclosed test fixture, and the disclosure is not intended to be limited to the particular examples provided herein.

FIG. 3 illustrates an exemplary crimp improvement and test process that can be utilized to improve and test a crimp connection. Crimp improvement and test process 100 starts at step 102. At step 104, the crimped end of the test part or wire bundle sample is fixtured in a stationary fixture. At step 106, the test part is fixtures in the tensioning device. The tensioning device can apply the tension and twist as disclosed herein. At step 108, the test leads are applied to the test part such that a resistance can later be measured across the test part. At step 110, the twist and/or tension load are applied to the test part. At step 112, the electrical test is conducted to determine the positive or negative effects of the twisting and tensile loads on the quality of the crimp. An optional additional process to define torque and/or load magnitude and direction and/or axis is illustrated in FIG. 3B where the purpose for testing is to find the highest resistance (and its variation) and the purpose for contact improvement is to find the lowest resistance (and its variation). While an exemplary electrical test and contact improvement process is illustrated in FIGS. 3 and 3B, any of the test methods disclosed herein or known in the art to test crimp quality can additionally or alternatively be used in the process. At step 114, the results of the test and/or crimp improvement operation are evaluated in order to judge the crimp quality improvement in the processed piece. At step 116, the crimp improvement and test ends. A number of exemplary processes can be operated according to the disclosed parameters, and a number of additional or alternative test steps are envisioned. The disclosure is not intended to be limited to the examples provided herein.

FIG. 4 illustrates an exemplary configuration testing a pair of connected terminals. Test part 205 is illustrated including wire bundle 210 and connected terminal 220 attached to wire bundle 212 and connected terminal 222. Wire bundle 210 includes exposed end 230, and wire bundle 212 includes exposed end 232. Terminal 220 includes an exemplary male connector, and terminal 222 includes an exemplary female connector. According to the disclosed test processes, test part 205 can be tested by monitoring resistances through the test part before a twisting force is applied and after (or during) the twisting force is applied and maintained through the test. By monitoring the electrical resistance of test part 205 through the test, an overall quality of the electrical connections within piece 205 can be evaluated. If test part 205 is shown to fail overall, individual portions of the test part can be tested to identify the low-quality or inadequate connection.

FIG. 5 illustrates an exemplary configuration testing a plastic connector with connected terminals therewithin. Test part 300 is illustrated including wire and plastic connector assembly 302 and wire and plastic connector assembly 304. Wire and plastic connector assembly 302 includes wire bundle 310, connected terminal 320, female plastic connector housing 340, and exposed end 330. Wire and plastic connector assembly 304 includes wire bundle 312, connected terminal 322, male plastic connector housing 342, and exposed end 332. According to the disclosed test processes, test part 300 can be tested by monitoring resistances through the test part before a twisting force is applied and after the twisting force is applied and maintained through the test. By monitoring the electrical resistance of test part 300 through the test, an overall quality of the electrical connections within piece 300 can be evaluated. If test part 300 is shown to fail overall, individual portions of the test part can be tested to identify the low-quality or inadequate connection.

Figure 6:
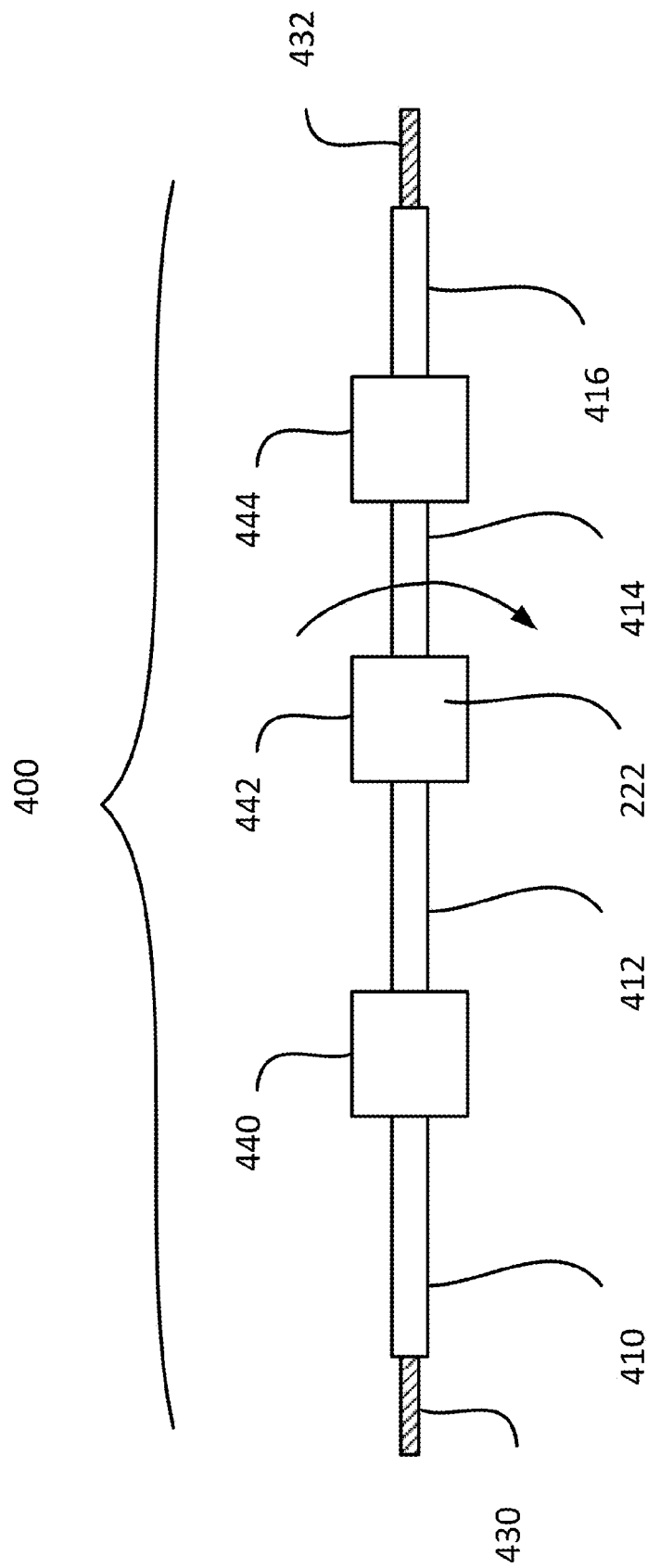
FIG. 6 illustrates an exemplary configuration testing a wiring harness with multiple connections, in accordance with the present disclosure.

FIG. 6 illustrates an exemplary configuration testing a wiring harness with multiple connections. Test part 400 is illustrated including wire bundles 410, 412, 414, and 416 connected in series by a plurality of plastic connector junctions 440, 442, and 443, respectively. Each of the plastic connector junctions includes a pair of connected terminals as is illustrated in FIGS. 4 and 5, electrically connecting the adjacent wire bundles. Wire bundles 410 and 416 each include an exposed end 430 and 432, respectively, such that a resistance through the test part 400 can be monitored through a test. In another embodiment, the ends can include additional connected terminals connected to one or both of ends 430 and 432. According to the disclosed test processes, test part 400 can be tested by monitoring resistances through the test part before a twisting force is applied and after (or during) the twisting force is applied and maintained through the test. By monitoring the electrical resistance of test part 400 through the test, an overall quality of the electrical connections within piece 400 can be evaluated. If test part 400 is shown to fail overall, individual portions of the test part can be tested to identify the low-quality or inadequate connection.

Figure 7:
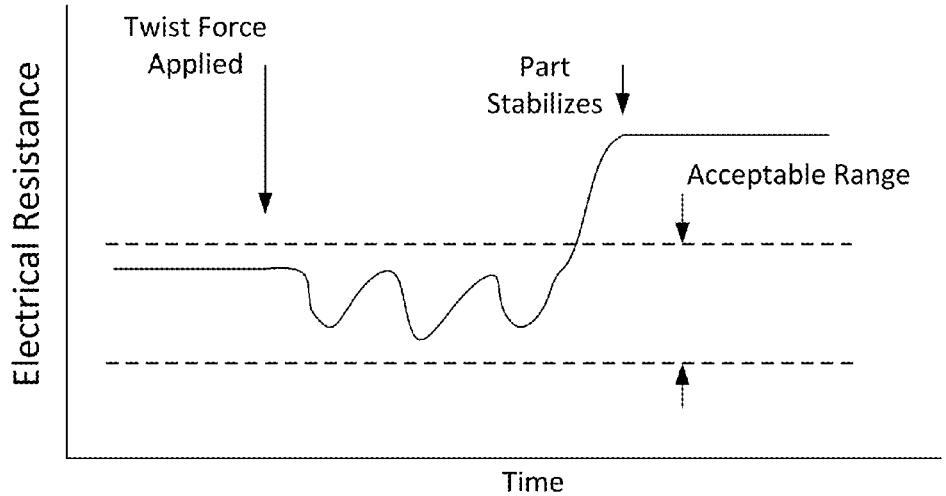
FIG. 7 illustrates exemplary test results showing a second resistance value going outside the accepted range, in accordance with the present disclosure.

FIG. 7 illustrates exemplary test results showing a second resistance value going outside the accepted range. An acceptable resistance range is in particular including a maximum acceptable resistance value or a threshold resistance value. Electrical resistance is monitored in a test part through a test period and criteria disclosed herein can be used to judge whether or not the electrical connections within the test part include quality connections. Electrical resistance for the test part is illustrated in the vertical axis, and time through the test period is illustrated in the horizontal axis. An acceptable range of electrical resistance is defined, wherein tested electrical resistance that is too high indicates a failure of the test part to function according to a designed electrical function. As the test part is initially tested in an untwisted state, the exemplary part is within the acceptable range. As the twisting force is applied, electrical resistance in the part is variable through a transient period. Electrical resistance in the transient period, although variable remains within the acceptable range. As the twisting force is maintained, the part stabilizes to a resistance value greater than an upper limit of the acceptable range. This unacceptably high resistance indicates that one or more of the crimped connections (or interconnected terminals) within the test part are unstable and that application of the twisting force indicates that the part should be indicated as a failed part.

Figure 8:
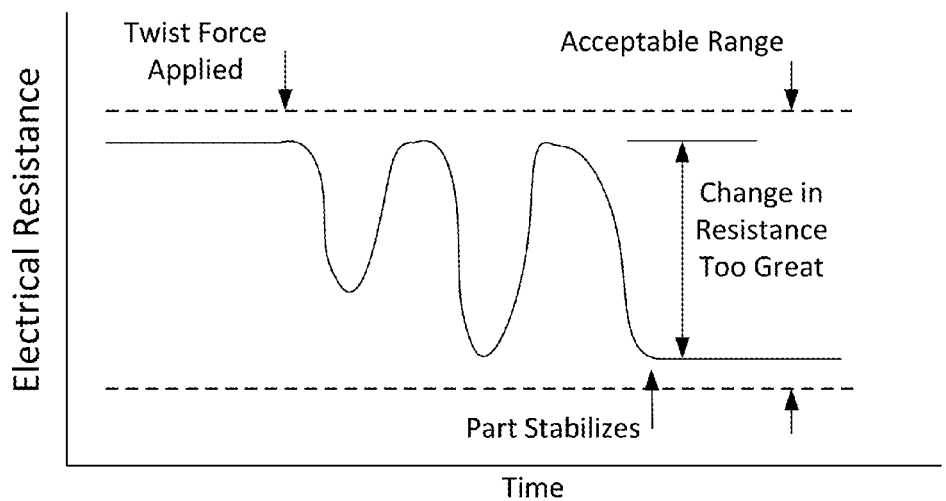
FIG. 8 illustrates exemplary test results showing too high of variation between the initial resistance value and the second resistance value indicating an unstable connection, in accordance with the present disclosure.

FIG. 8 illustrates exemplary test results showing too high of variation between the initial resistance value and the second resistance value indicating an unstable connection. Electrical resistance is monitored in a test part through a test period and criteria disclosed herein can be used to judge whether or not the electrical connections within the test part include quality connections. Electrical resistance for the test part is illustrated in the vertical axis, and time through the test period is illustrated in the horizontal axis. An acceptable range of electrical resistance is defined, wherein tested electrical resistance that is too high indicates a failure of the test part to function according to a designed electrical function. As the test part is initially tested in an untwisted state, the exemplary part is within the acceptable range toward an upper limit of the acceptable range. As the twisting force is applied, electrical resistance in the part is variable through a transient period. As the twisting force is maintained, the part stabilizes to a resistance value toward a lower limit of the acceptable range. The tested resistance values remained within the acceptable range throughout the test period. According to one exemplary test criteria, the exemplary test part could be passed as an acceptable part. However, according to another exemplary test criteria, the initial electrical resistance can be compared to the second stabilized electrical resistance with the test part twisted, and if the difference between the initial electrical resistance and the second stabilized resistance is too great, the test results can be used to indicate an unstable part that could loosen or be subject to excessive oxidation over time to become a failed part. According to this criterion, the test results can be used to indicate that one or more of the crimped connections (or interconnected terminals) within the test part are unstable and that application of the twisting force indicates that the part should be indicated as a failed part.

Figure 9:
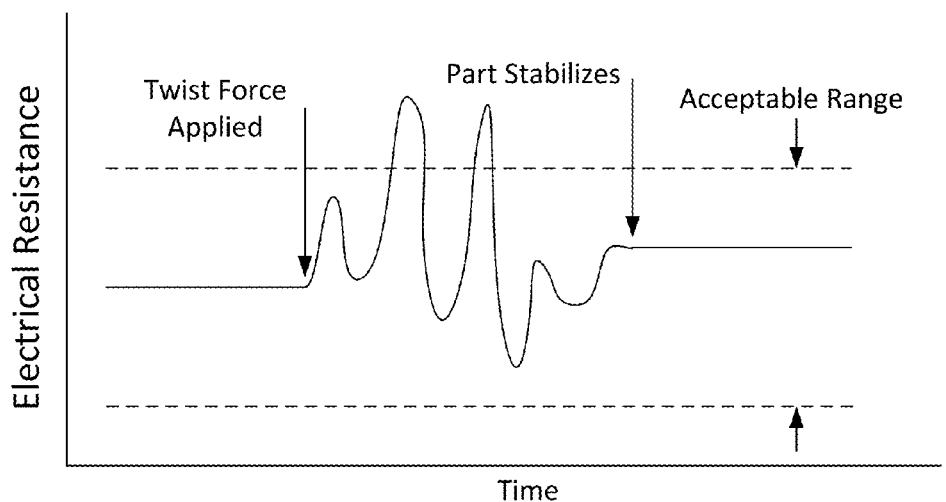
FIG. 9 illustrates exemplary test results showing too much variation during the test indicating an unstable connection, in accordance with the present disclosure.

FIG. 9 illustrates exemplary test results showing too much variation during the test indicating an unstable connection. Electrical resistance is monitored in a test part through a test period and criteria disclosed herein can be used to judge whether or not the electrical connections within the test part include quality connections. Electrical resistance for the test part is illustrated in the vertical axis, and time through the test period is illustrated in the horizontal axis. An acceptable range of electrical resistance is defined, wherein tested electrical resistance that is too high indicates a failure of the test part to function according to a designed electrical function. As the test part is initially tested in an untwisted state, the exemplary part is within the acceptable range. As the twisting force is applied, electrical resistance in the part is variable through a transient period. As the twisting force is maintained, the part stabilizes to a resistance value within the acceptable range. However, during the transient period, significant variability in the resistance is recorded. According to one exemplary test criteria, the exemplary test part could be passed as an acceptable part based upon the initial and second, stabilized electrical resistances being within the acceptable range. However, according to another exemplary test criteria, the initial electrical resistance monitored through the transient period can be monitored and compared to either the acceptable range or compared to a threshold absolute variation, and if the monitored resistance in the transient period either violates the acceptable range or exceeds the threshold absolute variation value, the test results can be used to indicate an unstable part that could loosen or be subject to excessive oxidation over time to become a failed part. According to this criterion, the test results can be used to indicate that one or more of the crimped connections (or interconnected terminals) within the test part are unstable and that application of the twisting force indicates that the part should be indicated as a failed part.

A fixture and related process are disclosed herein for testing a crimp quality and/or improving a crimp quality through application of a twist. It will be appreciated that testing of the crimp can be performed in isolation of improvement of the crimp according embodiments of the present disclosure.

Figure 10:
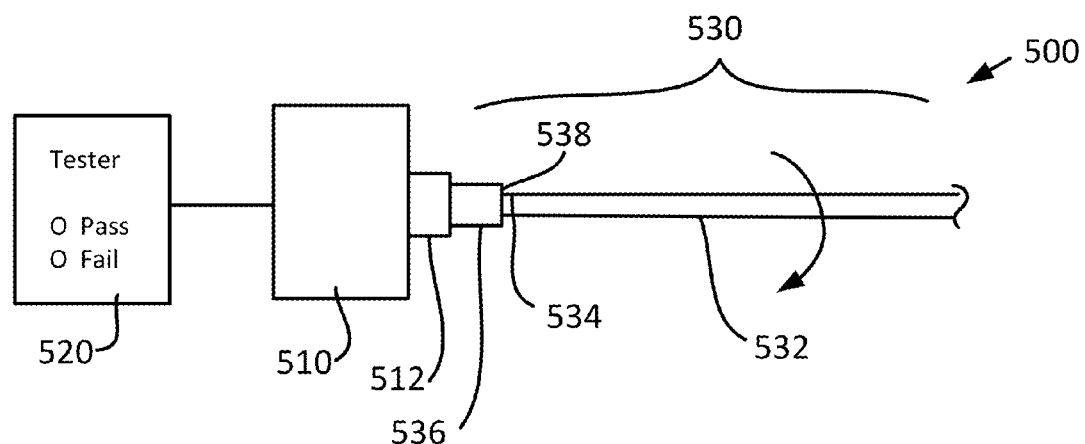
FIG. 10 illustrates an exemplary test configuration for determining proper function of an exemplary computerized module and a repair configuration for applying and locking a twist in a connected wire bundle, in accordance with the present disclosure.

FIG. 10 illustrates an exemplary test configuration for determining proper function of an exemplary computerized module and a repair configuration for applying and locking a twist in a connected wire bundle. Computerized module 510 is illustrated connected to test module 520. In an alternative configuration, module 510 can include a self-test function such that module 520 is unnecessary. Module 510 includes electrical connection 512 configured to accept and connect to plastic connector 536 of wire harness 530. Wire harness 530 includes plastic connector 536, wire bundle 532, and connected terminal 534. Plastic connector 536 and connected terminal 534 are joined at connector terminal junction 538. If computerized module 520 is tested and module 510 determines that module 520 fails an electrical test, the source of the failure could be a low-quality connection between one or more of the components of wire harness 530. A twisting force can be applied to wire harness 530. This twisting force can cause the wire bundle and connected terminal to shift, thereby changing gap sizes increasing contact areas between the surfaces of the wire bundle and the connected terminal, as disclosed herein. In the event that the applied twisting force and the resulting improved connection between the wire bundle and the connected terminal cause module 520 to subsequently pass the test when the twist is applied, the twist can be locked in by applying a locking mechanism to connector terminal junction 538. Such a locking mechanism can take many forms. For example, a wedge-shaped piece can be affixed between the connected terminal and the plastic connector, such that an interference fit is created and the terminal is locked in the twisted state. In one embodiment, the plastic connector can include snap tabs or other features known in the art configured to accept a wedge device and securely hold the wedge in place as the locking mechanism. In another example, glue can be used to adhere the terminal to the plastic connector in the twisted state, with the cured glue then acting as the locking mechanism. A number of locking mechanisms are envisioned, and the disclosure is not intended to be limited to the particular examples provided.

Figure 11:
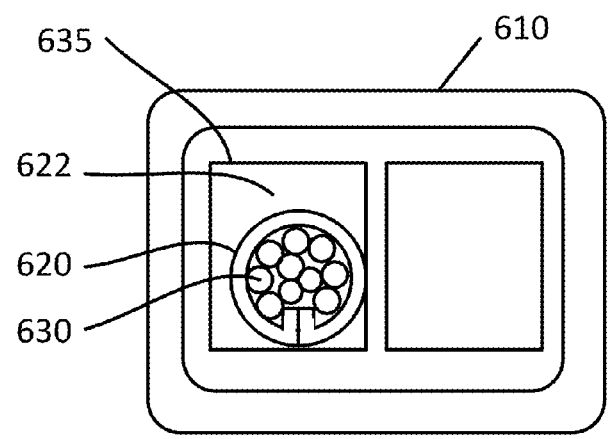
FIG. 11 illustrates an exemplary plastic connector including a connected terminal and a wire bundle, including an exemplary locking feature for locking a repairing twist in the part, in accordance with the present disclosure.

FIG. 11 illustrates an exemplary plastic connector including a connected terminal and a wire bundle, including an exemplary locking feature for locking a repairing twist in the part. Plastic connector 610 is illustrated including cavity 635 configured to accept connected terminal 620. Connected terminal 620 and wire bundle 630 are illustrated in cross-section, with wire bundle 630 illustrated crimped within connector 620. A gap 622 exists between walls of cavity 635 and terminal 620, such that the terminal can initially move in relation to plastic connector 610. If a repairing twisting force is applied to wire bundle 630 and terminal 620, the resulting twist can be locked in place by driving wedge device 640 into gap 622, thereby creating an interference fit between terminal 620 and the walls of cavity 635. In this way, a repairing twist can be locked in place.

A process to test an electrical connection quality of a test part comprising a connected terminal crimped onto a wire bundle is disclosed. Some or all of the process can be performed by an operator manually manipulating and testing the pieces. Some or all of the process can be computer controlled with automated equipment. The process includes affixing the metal wire bundle to a first fixture, affixing the connected terminal to a second fixture, applying a twisting force to the test part, testing an electrical resistance of the test part prior to the application of the twisting force and after (or during) the application of the twisting force, comparing the electrical resistances to a threshold electrical resistance, marking the test part with a failed indication based upon the comparing. Marking the test part can include physically marking the piece, electronically storing information in a computerized memory device that the particular part passed or failed the test, or any other means of indicating the test results for a particular part known in the art.

An alternative computerized process to test an electrical connection quality of a test part comprising a connected terminal crimped onto a wire bundle is disclosed. The process includes affixing the metal wire bundle to a first fixture, affixing the connected terminal to a second fixture, attaching electrical test leads to the test part. The process further includes, within a computerized processor, controlling application of a twisting force to the test part, testing an electrical resistance of the test part prior to the application of the twisting force and after (or during) the application of the twisting force, comparing the electrical resistances to a threshold electrical resistance, marking the test part with a failed indication based upon the comparing.

The computerized devices of the present disclosure can include non-limiting examples of a desktop or laptop computer, a dedicated computerized test stand in a manufacturing or testing facility, an electrical test device such as an ohm meter configured to record a set or range of values according to the disclosed processes, or any other similar computerized device capable of operating the processes disclosed herein. Where not specifically referenced or disclosed, the disclosure intends that computerized functions, database references, and other computerized tasks disclosed herein are performed using methods and programming practices known in the art.

Computerized devices include memory, e.g., read only memory (ROM) and random access memory (RAM), storing processor-executable instructions and one or more processors that execute the processor-executable instructions. In embodiments where the processing device includes two or more processors, the processors can operate in a parallel or distributed manner. The processing device can execute an operating system of the computerized device. The computerized device further includes durable memory in the form of a hard drive, flash memory, or other memory storage devices known in the art. The computerized device can store and operate programming configured to electrically test connections as disclosed herein and can command electrical motors to twist and/or apply axial load upon a test part. The computerized device can further include an output device configured to physically demonstrate the test results for a particular part, and can include routing the part on a conveyor system, marking the part with paint or an exemplary sticker, or graphically display a result upon a view screen.

The physical device including the fixtures for affixing the test part and applying forces to the test part can be manually operated, for example, with manual clamps holding the test part. An exemplary two position lever could twist the test part a calibrated rotational distance, thereby ensuring that the operator achieves the desired testing twist upon the part. In another example, the test can be partially or fully automated, with motorized features acquiring the test part and/or using a motor such as a step motor to twist and/or pull upon the test part by a determined amount.

Figure 12:
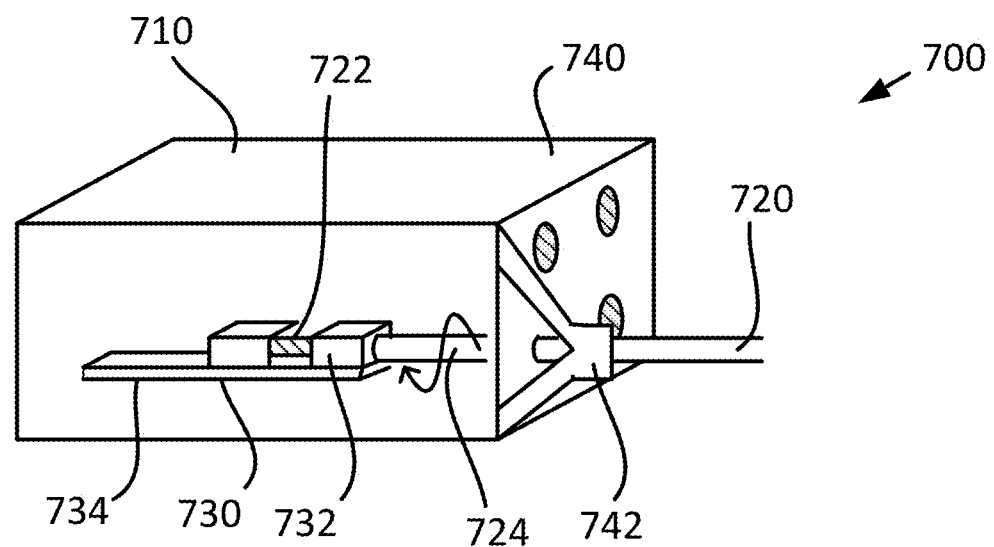
FIG. 12 illustrates an additional exemplary plastic connector including a connected terminal and a wire bundle, including an alternative exemplary locking feature built into the connector for locking a repairing twist in the part, in accordance with the present disclosure.

FIG. 12 illustrates an additional exemplary plastic connector including a connected terminal and a wire bundle, including an alternative exemplary locking feature built into the connector for locking a repairing twist in the part. Configuration 700 includes test part 710 including insulated wire bundle 720, connector terminal 730, and plastic connector 740. Insulated wire bundle 720 includes wire bundle 722 contained within insulation sheath 724. Connector terminal 730 includes terminal 734 and crimped connection 732 connecting the connector terminal to both wire bundle 722 and insulation sheath 724. Exemplary test part 710, having been determined to be a failed test part but also having been determined to include a passing electrical resistance once a twist was applied to the electrical connection, includes twisting retention clip 742 as part of plastic connector 740. Clip 742 grips, crimps, or otherwise attaches to insulation sheath 724 retaining the applied twist to the electrical connection. Steps to apply a twist to a failed part, determine that the part passes a resistance test with the twist applied, and take an action to mechanically fix the twist in the electrical connection can be executed by an automated fixture including a processor configured to determine the necessary resistance values, make the determination, and control motors to apply the mechanical fix to the twist.

Figure 13:
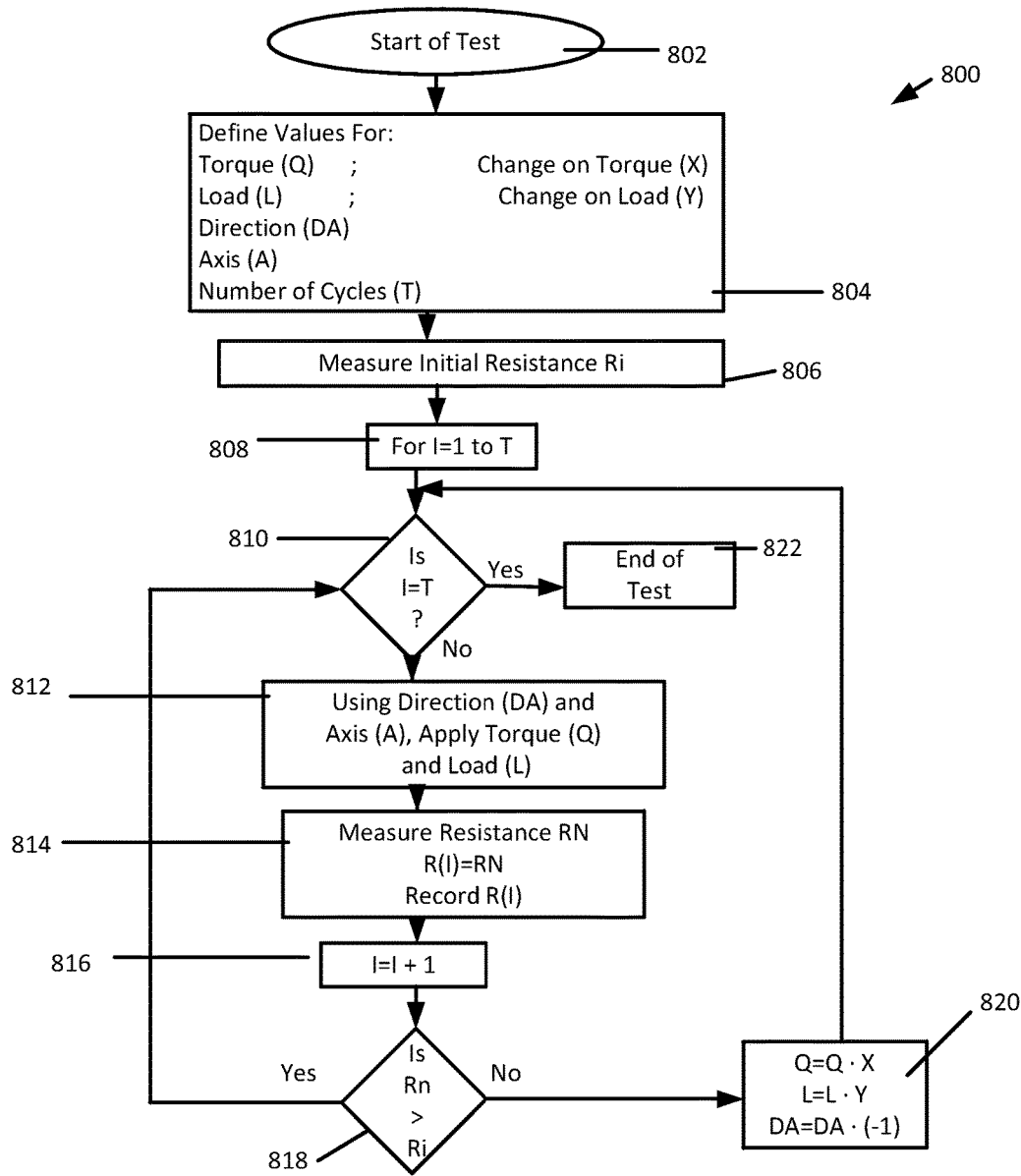
FIG. 13 illustrates an exemplary test process including testing an electrical connection in a first twist direction and then in a second twist direction for purposes of testing to find parts that fail with high resistance values or that indicate that over time the part will degrade due to oxidation, in accordance with the present disclosure.

FIG. 13 illustrates an exemplary test process including testing an electrical connection in a first twist direction and then in a second twist direction for purposes of testing to find parts that fail with high resistance values or that indicate that over time the part will degrade due to oxidation. Process 800 can be computerized and complete run by a computerized test stand including electrical motors and a processor configured with programming configured to operate the illustrated process. Process 800 starts at step 802. At step 804, a user can input by various means known in the art any of a number of test parameters. For example, the user can set torque, load, direction of twist, an axis of loading, a number of cycles for the test, and degrees of which torque and load can be incrementally changed during the test. At step 806, an initial resistance is measured. At step 808, a timer is initiated for a number of test cycles. At step 810, the process checks to see if the test is complete. If the test is complete, the process goes to step 822 where the test ends. If the test is not complete, the process advances to step 812. At step 812, the process uses values for direction of twist and loading axis to apply a torque and a load. At step 814, a resistance is measured for the cycle. At step 816, the cycle is advanced one count. At step 818, the resistance for the cycle is compared to the initial resistance. It will be appreciated that the resistance for the cycle could be alternatively compared with any value, for example, a threshold high resistance value. If the resistance for the cycle is greater than the initial resistance, then the process returns to step 810 to reiterate the test cycle with the same operating parameters as the previous cycle. If the resistance for the cycle is less than the initial resistance, then the process advances to step 820 where values for the test process are altered, for example, in magnitude and/or direction. The process then returns to step 810 to reiterate the cycle with the new operating parameters as modified by step 820. The process illustrated is provided as an example, and it will be appreciated that a number or alternative test processes and alternate steps in the illustrated process can be utilized in accordance with the disclosure.

Figure 14:
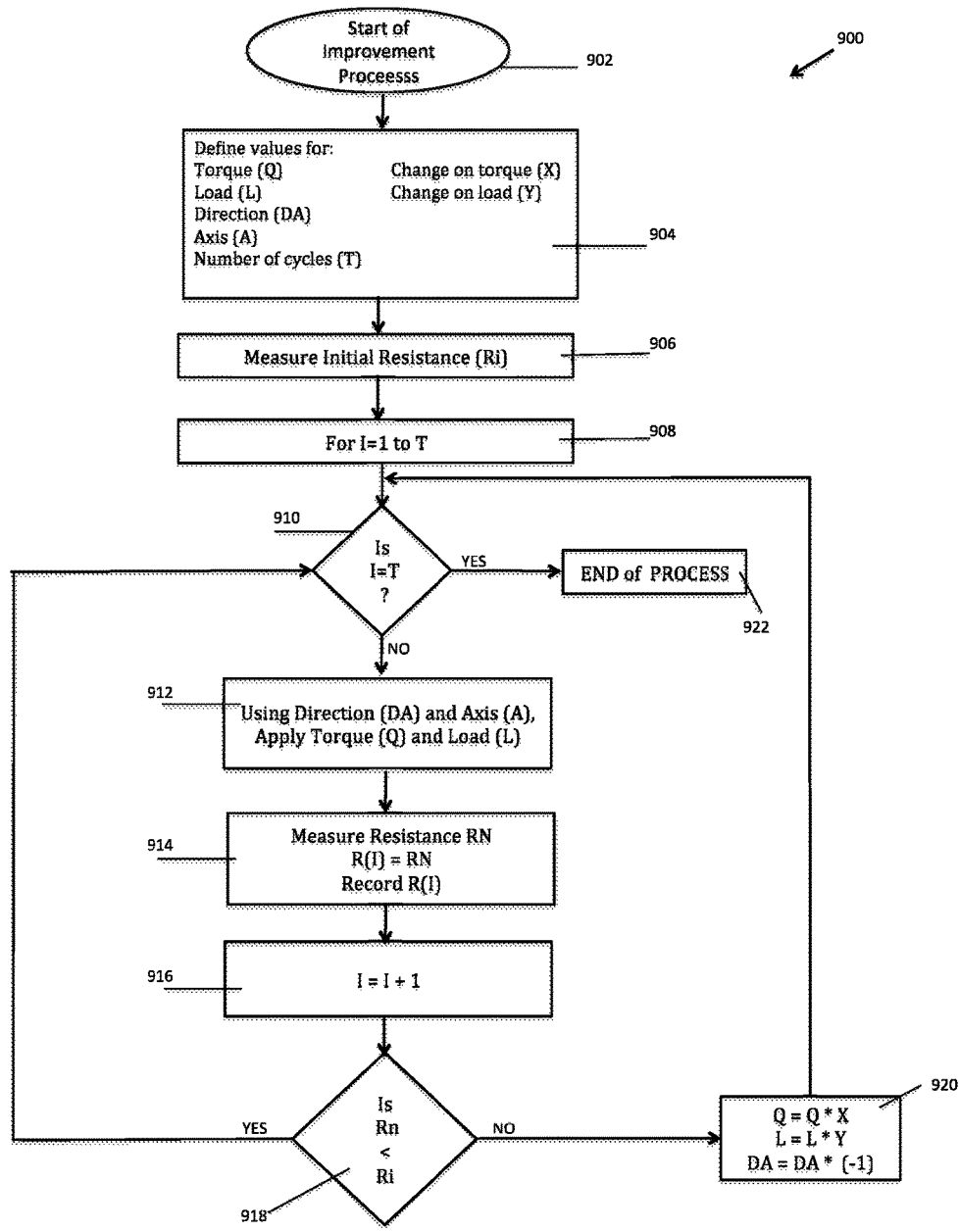
FIG. 14 illustrates an exemplary test process including testing an electrical connection in a first twist direction and then in a second twist direction for the purposes of improving a connection quality and optionally locking in the improved connection by twisting the part, in accordance with the present disclosure.

FIG. 14 illustrates an exemplary test process including testing an electrical connection in a first twist direction and then in a second twist direction for the purposes of improving a connection quality and optionally locking in the improved connection by twisting the part. Process 900 can be computerized and complete run by a computerized test stand including electrical motors and a processor configured with programming configured to operate the illustrated process. Process 900 starts at step 902. At step 904, a user can input by various means known in the art any of a number of test parameters. For example, the user can set torque, load, direction of twist, an axis of loading, a number of cycles for the test, and degrees of which torque and load can be incrementally changed during the test. At step 906, an initial resistance is measured. At step 908, a timer is initiated for a number of test cycles. At step 910, the process checks to see if the test is complete. If the test is complete, the process goes to step 922 where the test ends. If the test is not complete, the process advances to step 912. At step 912, the process uses values for direction of twist and loading axis to apply a torque and a load. At step 914, a resistance is measured for the cycle. At step 916, the cycle is advanced one count. At step 918, the resistance for the cycle is compared to the initial resistance. It will be appreciated that the resistance for the cycle could be alternatively compared with any value, for example, a threshold acceptable resistance value. If the resistance for the cycle is less than the initial resistance, then the process returns to step 910 to reiterate the test cycle with the same operating parameters as the previous cycle. If the resistance for the cycle is greater than the initial resistance, then the process advances to step 920 where values for the test process are altered, for example, in magnitude and/or direction. The process then returns to step 910 to reiterate the cycle with the new operating parameters as modified by step 920. The process illustrated is provided as an example, and it will be appreciated that a number or alternative test processes and alternate steps in the illustrated process can be utilized in accordance with the disclosure.

The processes of FIGS. 13 and 14 are provided as examples. The disclosed test processes can be operated for one cycle, for example, manually by an operator to test or improve a particular part or sample. The processes can be operated through tens, hundreds, or thousands of cycles, depending upon the conditions that the user intends to simulate or the nature of the testing or improvement being done. In some instances, the materials being used will determine how many cycles can be performed, for example, with a brass fitting being limited to approximately ten cycles and with a copper fitting being capable of a test with an exemplary 2,000 cycles.

Reversal of test direction can be based upon what the user is attempting to find. For example, if a user is looking to confirm the part as a failed part, and the part fails in the first direction of twist, no need to reverse the twist direction is necessary. If however, the part passes the test in the first direction, the user can reverse the twist direction to see if the test then fails the part in the second direction. For the purposes of crimp improvement, the same can be said with the opposite criterion. If the part improves or passes with the first direction of twist, the user knows how to improve the crimp connection quality and twisting in the second direction is unnecessary. If the part fails to improve or fails the test in the first direction, the user can apply the twist in the other direction to see if the other twist direction causes the part to improve or pass.

The test process disclosed herein includes twisting the test part or applying a torque to the test part in at least one direction. The test process can also include applying an axial load to the part. The test process can also include other environmental conditions or conditioning to further simulate environmental effects on the parts or simulate aging on the parts. For example, a stream of hot air such as can be put out by a hair drier or an industrial equivalent can be used to heat the part as it is being tested. Humidity can be increased to further simulate conditions and aging upon the test piece. Other test factors can similarly be added or altered, and the disclosure is not intended to be limited to the examples provided herein.

The disclosure has described certain preferred embodiments and modifications of those embodiments. Further modifications and alterations may occur to others upon reading and understanding the specification. Therefore, it is intended that the disclosure not be limited to the particular embodiment(s) disclosed as the best mode contemplated for carrying out this disclosure, but that the disclosure will include all embodiments falling within the scope of the appended claims.

The invention claimed is:

1. An apparatus for testing the quality of an electrical connection of a test part, the apparatus comprising:
   a first fixture configured to hold an electrical terminal of a test part the electrical terminal having an electrical connection with a first section of an electrical conductor of the test part;
   a second fixture configured to hold a second section of the electrical conductor wherein the second fixture is rotatable to apply a twist to the electrical conductor and impart a force on the connection between the first second of the electrical conductor and the electrical terminal; and
   an electrical test module configured to measure an electrical resistance of the electrical connection between the electrical terminal and the electrical conductor of the test part when the twist is applied to the test part, the electrical test module including a first lead connected to the electrical terminal and a second lead connected to the electrical conductor.

2. The apparatus of claim 1, wherein the test part comprises an electrical conductor and an electrical terminal joined with a crimp connection.

3. The apparatus of claim 1, wherein the test part comprises a first electrical conductor and a first electrical terminal joined with a first crimp connection and a second electrical conductor and a second electrical terminal joined with a second crimp connection, wherein the electrical terminals are joined together with a male to female interference fit connection.

4. The apparatus of claim 1, wherein the test part comprises a electrical switch wherein two metallic terminals are configured to selectively join to connect the switch.

5. The apparatus of claim 1, wherein the first fixture and the second fixture are rotatable to apply an axial load upon the test part.

6. The apparatus of claim 1, wherein the electrical test module is configured to measure a change in electrical resistance of the test part at a time prior to the applied twist and at a time after the applied twist.

7. The apparatus of claim 1, wherein the electrical test module is configured to measure a change in electrical resistance of the test part through a test period, the test period including a time prior to the applied twist and a time after the applied twist.

8. The apparatus of claim 1, wherein the electrical test module comprises a processing device configured to monitor the electrical resistance, compare the electrical resistance to a threshold electrical resistance, and provide a failure indication if the monitored electrical resistance exceeds the threshold resistance.

9. The apparatus of claim 8, wherein the processing device is further configured to monitor the electrical resistance through a test period wherein the twist applied to the test part comprises an increasing torque through the test period.

10. The apparatus of claim 9, wherein the processing device is further configured to compare a plurality of electrical resistance values monitored through the test to a threshold change in resistance and provide the failure indication if the plurality of resistance values change by more than the threshold change in resistance through the test period.

11. The apparatus of claim 8, wherein the processing device is further configured to monitor the electrical resistance through a first test period wherein the twist applied to the test part comprises an increasing torque in a first direction through the first test period and subsequently monitor the electrical resistance through a second test period wherein the twist applied to the test part comprises an increasing torque in a second direction through the second test period.

12. The apparatus of claim 1, further comprising a device providing a stream of hot air to blow on the electrical connection.

13. The apparatus of claim 1, further comprising a device providing increased humidity to air surrounding the electrical connection.

14. The apparatus of claim 1, further comprising a twist fixing mechanism to fix the twist in the electrical connection when a test result shows that the twist improves the electrical connection.

15. The apparatus of claim 14, wherein the twist fixing mechanism comprises one of a wedge device, glue, and a twisting retention clip connected to a plastic connector.

16. A process to test an electrical connection quality of a test part comprising a connected terminal joined to an electrical conductor, the process comprising:
affixing a first section of the electrical conductor to an electrical terminal to form an electrical connection between the electrical conductor and the terminal;
affixing the electrical terminal to a first fixture;
affixing a second section of the electrical conductor to a second fixture;
applying a twisting force to the test part;
measuring an electrical resistance of the connection between the electrical terminal and the electrical conductor prior to the application of the twisting force and after the application of the twisting force;
comparing the electrical resistances measured to a threshold electrical resistance;
measuring the electrical resistance of the test part during the application of the twisting force; and
determining whether the test part passed or failed based upon the comparing.

17. The process of claim 16, further comprising iteratively cycling the test.

18. A computerized process to test an electrical connection quality of a test part comprising a connected terminal joined to an electrical conductor, the process comprising:
affixing a first section of the electrical conductor to an electrical terminal to form an electrical connection between the electrical conductor and the terminal;
affixing the electrical terminal to a first fixture;
affixing a second section of the electrical conductor to a second fixture;
attaching electrical test leads to the test part on the electrical conductor and on the electrical terminal;
within a computerized processor, controlling application of a twisting force to the test part;
testing or measuring an electrical resistance of the connection between the terminal and the electrical conductor prior to the application of the twisting force and after the application of the twisting force;
comparing the electrical resistances to a threshold electrical resistance; and
determining whether the test part passed or failed based upon the comparing.

19. The process of claim 18, wherein the computerized processor further tests the part during the application of the twisting force.

20. The process of claim 18, wherein the computerized processor further tests the part during application of a twisting force in a second, opposite direction.

* * * * *